ANGLE MODULATED CARRIER WAVE RECEIVER

Filed Feb. 27, 1948

INVENTOR
JACK AVINS
BY Philip J. Cooper
ATTORNEY

Patented May 6, 1952

2,595,441

UNITED STATES PATENT OFFICE 2,595,441

ANGLE MODULATED CARRIER WAVE RECEIVER

Jack Avins, Staten Island, N. Y., assignor to Radio Corporation of America, a corporation of Delaware Application February 27, 1948, Serial No. 11,415

6 Claims. (Cl. 250—20)

This invention relates generally to angle-modulated carrier-wave receivers, and particularly relates to a frequency discriminator such as a ratio detector arranged to develop a negative feedback voltage for controlling a carrier-wave amplifier so as to vary its gain inversely with undesired variations in amplitude of the angle-modulated carrier wave.

Various circuits have been devised in the past for demodulating an angle-modulated carrier-wave. The term "angle-modulated carrier wave" is meant to include either a frequency-modulated or a phase-modulated carrier wave or hybrid forms of modulation possessing characteristics common to both of them. During the generation, transmission, or reception of an angle-modulated carrier wave, undesired amplitude modulation of the carrier may arise. This may be caused by the transmitter, by the combination of the wave with interfering impulses such as external noise, by the lack of uniform gain over the entire pass band of the signal selector, or, finally, the undesired amplitude modulation may be caused by interference of the waves which have traveled over different paths between the transmitter and the receiver. Apart from the coincidental amplitude modulation of an angle-modulated carrier wave which may arise in the manner just described, the angle-modulated wave may also have its amplitude modulated in other ways.

One known method for overcoming the effect of undesired amplitude modulation is to provide a limiter stage ahead of the frequency discriminator in order to limit the amplitude of the modulated carrier wave to a constant maximum value. However, sufficient amplification must be provided to raise the amplitude of the weakest signal at least to the level at which limiting is effective, therefore, more amplification is required than would be necessary if no limiter stage were employed. Thus, an angle-modulated carrier wave receiver which does not need a limiter stage will require fewer tubes and circuit elements than a receiver having a conventional frequency demodulator. Another method of reducing the effect of amplitude modulation is inherent in the "ratio detector" which is a particular type of frequency discriminator or demodulator. This circuit, in first approximation, is inherently less responsive to the undesired amplitude modulation of an angle-modulated carrier wave than other discriminator circuits. A conventional ratio detector has been described on pages 140 to 147 of the book "F-M Simplified"

by Milton S. Kiver published in 1947, by D. Van Nostrand Co., Inc., New York, New York. However, even such a ratio detector is responsive to a limited extent to the undesired amplitude modulation of an angle-modulated carrier wave, particularly when its amplitude decreases to a very low value, that is, if the present amplitude modulation becomes very large, the corresponding disturbance will be partially reproduced. Hence, it is obvious that it is desirable to provide some means for automatically reducing the undesired amplitude modulation of an angle-modulated carrier wave without the necessity of employing a limiter stage with its inherent disadvantages.

It is, accordingly, the principal object of the present invention to provide, in an angle-modulated carrier wave receiver, a frequency discriminator having means for eliminating the effects of the undesired amplitude modulation of an angle-modulated carrier wave and which does not require a limiter stage.

A further object of the invention is to develop, in the frequency discriminator of an angle-modulated carrier wave receiver, a gain control voltage responsive to undesired variations in the amplitude of the angle-modulated carrier wave for automatically controlling the gain of a carrier wave amplifier thereby to maintain substantially constant the amplitude of the carrier wave which is applied to the discriminator.

Another object of the invention is to provide a ratio detector having means for deriving a negative feedback voltage which is responsive to undesired rapid variations in amplitude of the angle-modulated carrier wave for controlling the gain of an intermediate-frequency amplifier ahead of the ratio detector.

An angle-modulated carrier wave receiver in accordance with the invention includes a frequency discriminator having an impedance element such as a resistor in its output circuit. The voltage across this resistor is responsive to instantaneous variations of the current flowing through the rectifiers of the frequency discriminator and is utilized in accordance with the present invention as a negative feedback voltage. That is, the negative feedback voltage is impressed upon a carrier-wave amplifier by a negative feedback circuit connected across the resistor for the purpose of controlling the carrier-wave amplifier so as to vary its gain inversely with instantaneous variations in the amplitude of the carrier wave.

Specifically, there may be provided in accordance with the present invention a ratio detector including two rectifiers and a rectifier output circuit. An impedance element is included in the rectifier output circuit and connected to one of the rectifiers. The negative feedback voltage which controls the gain of the carrier-wave amplifier is developed across this impedance element.

The novel features that are considered characteristic of this invention are set forth with particularlity in the appended claims. The invention itself, however, both as to its organization and method of operation, as well as additional objects and advantages thereof, will best be understood from the following description when read in connection with the accompanying drawing, in which:

Figure 1:
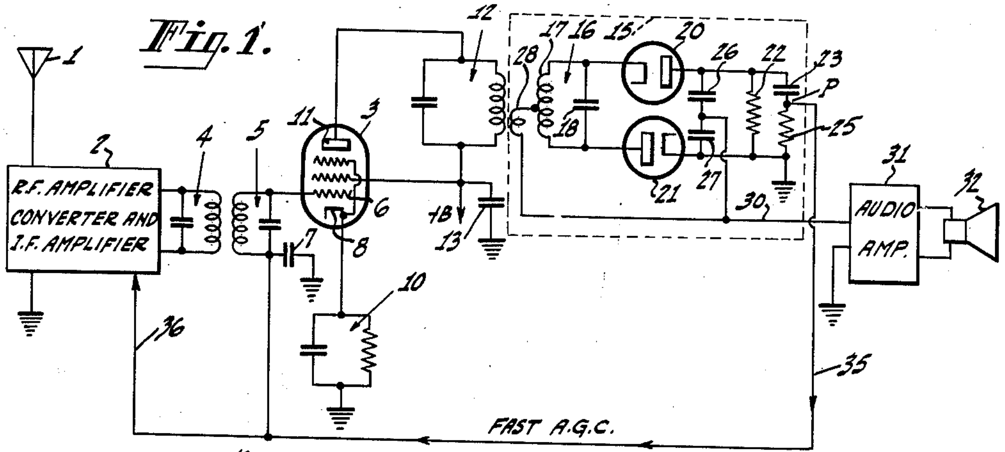
Fig. 1 is a circuit diagram, partly in block form, of an angle-modulated carrier-wave receiver embodying the present invention.

Referring now to Fig. 1 there is illustrated a superheterodyne radio receiver for receiving an angle-modulated carrier wave which may be intercepted by antenna 1. The carrier wave may be amplified by one or more radio-frequency amplifiers, converted to an intermediate-frequency wave and further amplified by one or more intermediate-frequency amplifiers, the necessary components being generally indicated by box 2, in accordance with conventional practice. The amplification of at least one of the radio-frequency or intermediate-frequency amplifiers indicated by box 2 is arranged to be varied by the applied grid bias voltage. Thus, the amplification of the carrier-wave is a function of the applied grid bias voltage. The last intermediate-frequency amplifier or driver is illustrated at 3.

It will be understood that radio-frequency amplifier, converter, intermediate-frequency amplifier 2 and driver 3 are adapted to receive and amplify not only frequency-modulated carrier waves but also phase-modulated waves. The generic expression "angle modulation" also includes a modulated carrier-wave of preferably constant amplitude where the modulation contains components resembling both frequency and phase modulation and is therefore a hybrid modulation.

The penultimate intermediate-frequency amplifier included within box 2 has a tuned output circuit 4. The intermediate-frequency wave to which the intercepted carrier wave is converted has conventionally a frequency of 10.7 megacycles in present frequency-modulated carrier-wave broadcast receivers. Output circuit 4 is accordingly broadly tuned to a frequency of 10.7 megacycles. Output circuit 4 is inductively coupled to tuned input circuit 5 having its high alternating-potential terminal connected to control grid 6 of intermediate-frequency amplifier or driver 3. The gain of driver 3 may be varied by applying an automatic gain control voltage to control grid 6. The low alternating-potential terminal of input circuit 5 is bypassed to ground for intermediate-frequency currents by bypass condenser 7. Cathode 8 of driver 3 is connected to ground through self-bias network 10. The suppressor grid of driver 3 is tied to cathode 8 while the screen grid is connected to a suitable source of positive voltage indicated at +B in accordance with conventional practice. Plate 11 of driver 3 is connected to tuned output circuit 12 having its low alternating-potential terminal connected to +B and bypassed to ground for intermediate-frequency currents by bypass condenser 13.

A ratio detector generally indicated at 15 is coupled to driver 3. Ratio detector 15 is of the type disclosed and claimed in the U. S. Patent 2,496,818 to Stuart W. Seeley, granted on February 7, 1950, entitled "Angle Modulation Detectors" and assigned to the same assignee as the present application. Ratio detector 15 includes a frequency-discriminator network comprising secondary resonat circuit 16 consisting of secondary coil 17 and condenser 18 connected in parallel. Secondary circuit 16 is inductively coupled to primary output circuit 12.

The frequency-discriminator network including secondary circuit 16 is connected to the input electrodes of two rectifiers 20 and 21 which may be separate diodes as illustrated, or twin diodes. The cathode of diode 20 and the anode of diode 21 are connected respectively to the terminals of secondary circuit 16. The output electrodes of the diodes, that is, the anode of diode 20 and the cathode of diode 21 are interconnected through resistor 22, bypassed by stabilizing condenser 23. The cathode of diode 21 may be connected to ground as illustrated. As disclosed and claimed in the above-identified Seeley patent a resistor 25 is connected in series with bypass condenser 23 and the cathode of diode 21. Stabilizing condenser 23 has a capacitance of such a value that it presents a low impedance to both the intermediate-frequency and the audio-frequency currents. The time constant of resistor 22 and stabilizing condenser 23 is of the order of .2 second so that the bias voltage developed across resistor 22 and condenser 23 is allowed to vary slowly compared to one cycle of the modulation signal. Substantially all the unidirectional current flowing through diodes 20 and 21 will flow through bypass resistor 22.

Between the anode of diode 20 and the cathode of diode 21 there are provided two load condensers 26 and 27 of substantially equal capacitance arranged in series. Load condensers 26 and 27 present a low impedance path to intermediate-frequency currents but have a high impedance for audio-frequency currents. The junction point of condensers 26 and 27 is connected to the low alternating-potential terminal of tertiary coil 28 having its high alternating-potential terminal connected to the midpoint of secondary coil 17. Tertiary coil 28 is tightly coupled to primary circuit 12. Since the cathode of diode 21 is grounded, the junction point of load condensers 26, 27 is at an intermediate-frequency ground potential and so is the anode of diode 20.

Ratio detector 15 responds to angle-modulated carrier waves in a conventional manner. As long as the frequency of the modulated carrier-wave is at the center frequency, the currents through diodes 20 and 21 are equal in magnitude, and no audio signal is derived from lead 30 connected to the junction point between load condensers 26 and 27. However, when the frequency of the carrier wave deviates from the center frequency in response to the modulation signal, the frequency-discriminator network becomes unbalanced, and the currents flowing through diodes 20 and 21 are consequently of unequal magnitude. The voltage across bypass resistor 22 and stabilizing condenser 23 is maintained substantially constant for short-time variations. Accordingly, the voltage at the junction point of load condensers 26, 27 varies with the frequency of the carrier wave. Thus, the demodulated audio signal obtained from lead 30 may be amplified by one or more audio amplifiier stages included within box 31 and may be reproduced by loud speaker 32.

Resistor 25 arranged in series with stabilizing condenser 23 has the effect of reducing the response of ratio detector 15 to coincidental amplitude modulation. This is due to the fact that only a certain percentage of the bias voltage developed across bypass resistor 22 and stabilizing condenser 23 is maintained constant for short time variations while a portion of the bias voltage is allowed to vary at an audio rate. Actually, the resistance of resistor 25 required to make ratio detector 15 substantially insensitive to coincidental amplitude modulation is determined by the transformer of circuits 12 and 16. In particular, the resistance value of resistor 25 is determined by the ratio between the voltage induced in secondary coil 17 and the voltage developed in tertiary coil 28. As taught in the Seeley patent above referred to, this voltage ratio should be close to unity which would require the resistance value of resistor 25 to be comparatively small.

In accordance with the present invention, it is preferred to make the ratio of secondary to tertiary voltage relatively small, that is, smaller than unity by making the voltage induced in tertiary coil 28 large compared to that induced in secondary coil 17. In this case, the optimum ratio detector action is secured with a relatively large resistance value for resistor 25. This is also desirable in order to derive a large feedback voltage in accordance with the present invention. However, if the ratio of secondary to tertiary voltage becomes too small, the peak separation of the ratio detector may also become too small. In other words, the linear portion of the curve obtained when the audio output current is plotted with respect to the frequency deviation may become insufficient to demodulate the carrier wave without distortion. It should be pointed out, however, that the frequency deviation of the sound carrier in a television system does not exceed 25 kilocycles as compared to 75 kilocycles for a standard broadcast wave which will permit a smaller ratio of the secondary to the tertiary voltage which, in turn, will permit to use a larger resistance value for resistor 25.

It will accordingly be seen that only a certain percentage of the bias voltage developed across bypass resistor 22 and stabilizing condenser 23 is stabilized.

Thus, if the amplitude of the modulated carrier wave suddenly varies, the voltage at the junction point P of stabilizing condenser 23 and resistor 25 will also vary. Assuming, for example, that the amplitude of the carrier rises suddenly, then junction point P becomes more negative. This voltage may be obtained from lead 35 connected between junction point P and the low alternating-potential terminal of tuned input circuit 5. This voltage, therefore, is applied to control grid 6 of driver 3, and to the control grids of the preceding amplifier tubes within box 2. Consequently, the gain of driver 3 is reduced, which, in turn, will reduce the amplitude of the carrier wave impressed upon ratio detector 15. On the other hand, if the amplitude of the carrier wave is suddenly reduced, the voltage derived across resistor 25 becomes less negative, thus increasing the gain of driver 3, which, in turn, will increase the amplitude of the carrier wave impressed upon ratio detector 15.

It will accordingly be seen that a voltage is developed across resistor 25 responsive to instantaneous amplitude variations of the current flowing through both diodes 20 and 21 which may be used as an automatic gain control (AGC) voltage. This negative feedback voltage is derived across resistor 25 and impressed upon driver 3 through lead 35 to control intermediate-frequency amplifier 3 so as to vary its gain inversely with instantaneous or fast variations in the amplitude of the carrier wave. Since the voltage across stabilizing condenser 23 is maintained substantially constant, the negative feedback voltage may also be derived across the series combination of stabilizing condenser 23 and resistor 25. Preferably, the negative feedback voltage is impressed on the last intermediate-frequency amplifier or driver 3 but it may also be impressed on other intermediate-frequency or radio-frequency amplifier stages as indicated by lead 36. It will be understood that the negative feedback voltage obtained from lead 35 is responsive to short-time or instantaneous variations of the carrier amplitude of the order of a cycle of the audio signal and may therefore be termed a fast automatic gain control voltage (AGC) as indicated in Fig. 1.

The selected value of resistor 25 thus controls the percentage of the bias voltage developed across bypass resistor 22 and stabilizing condenser 23 which is not stabilized. In practising the present invention, it is desired to stabilize approximately 80 percent of the bias voltage, and accordingly, the resistance of resistor 25 should be approximately 20 percent of the total diode load resistance. Thus, resistor 22 may have a resistance value of 7,000 ohms, resistor 25 may have a resistance value of 1,000 ohms and stabilizing condenser 23 may have a capacitance of 5 microfarads. Since the resistance of resistor 25 is still comparatively small compared to the total load resistance, the voltage developed across resistor 25 may not be sufficiently large to control the gain of driver 3 in such a manner as to compensate automatically for variations in amplitude of the carrier wave. In order to overcome this limitation it may be preferred to utilize the circuit of Fig. 2.

Figure 2:
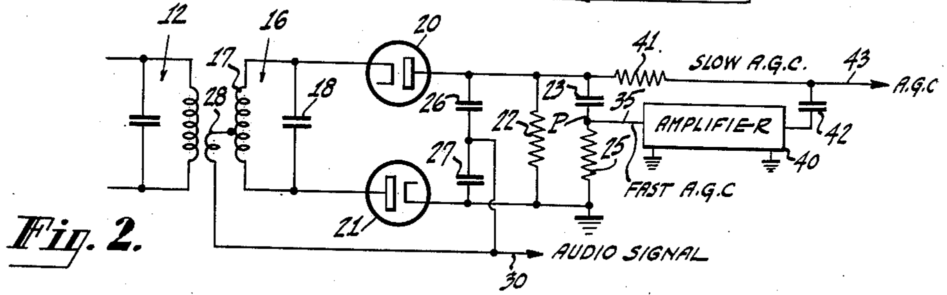
Fig. 2 is a circuit diagram of a ratio detector having circuit means for deriving a slow and a fast gain control voltage in accordance with the present invention.

Referring now to Fig. 2, there is illustrated a circuit including a ratio detector which is identical with the ratio detector 15 of Fig. 1. The angle-modulated carrier wave may be impressed on primary resonant circuit 12 which may be connected to an intermediate-frequency amplifier in the manner illustrated and explained in connection with Fig. 1. The demodulated audio signal may again be obtained from output lead 30 which may be connected to an audio amplifier and loud speaker such as illustrated at 31 and 32 in Fig. 1.

The negative feedback or AGC voltage is obtained from lead 35 connected to junction point P between stabilizing condenser 23 and resistor 25. In this case, however, the other end of lead 35 is connected to amplifier 40, which preferably has a wide pass-band, to obtain degeneration over the wide frequency range of the undesired amplitude modulation of the wave which represents noise. A conventional or slow automatic gain control voltage may also be derived from the junction point between stabilizing condenser 23 and the anode of diode 20 through filter resistor 41. The amplified negative feedback voltage responsive to fast variations in amplitude of the carrier wave may be combined with the conventional or slow automatic gain control voltage through coupling condenser 42 and the combined gain control voltages may be obtained from lead 43. The combined gain control voltages obtained from lead 43 may be impressed on one or more intermediate-frequency amplifier stages such as driver 3 as shown in Fig. 1. The basic circuit of Fig. 2 operates in the same manner as that of Fig. 1 so that a further explanation of its operation is not required here. The magnitude of the negative feedback voltage which is responsive to instantaneous variations in amplitude of the carrier wave may be adjusted to the desired value by controlling the gain of amplifier 40.

Figure 3:
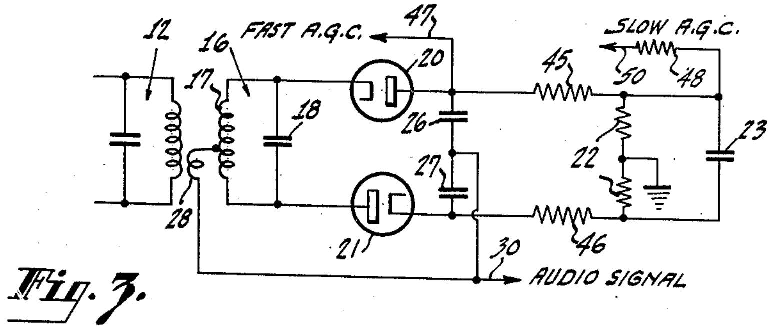
Fig. 3 is a circuit diagram of a modified ratio detector for deriving a negative feedback voltage in accordance with the invention.

Referring now to Fig. 3, the application of the present invention to a modified ratio detector has been illustrated. The circuit shown provides means for deriving a gain control voltage responsive to instantaneous variations in amplitude of the modulated carrier wave from the ratio detector disclosed and claimed in the co-pending U. S. Patent 2,501,077 to T. Murakami, granted on March 21, 1950, entitled "Ratio Detector Circuit" and assigned to the same assignee as the present application.

As described in greater detail in the Murakami patent referred to, the angle-modulated carrier wave is impressed on primary resonant circuit 12 which may be connected to an intermediate-frequency amplifier in the manner illustrated in Fig. 1. The frequency-discriminator network of the ratio detector including secondary resonant circuit 16 and tertiary coil 28 is identical with that of ratio detector 15 of Fig. 1. Resistor 22 which has its mid-point connected to ground, is connected between the output electrodes of diodes 20 and 21 to form a direct current path therewith. Resistor 22 is bypassed by stabilizing condenser 23. The demodulated audio signal is developed across one of the two load condensers 26 and 27 and may be obtained from output lead 30.

As disclosed in the Murakami patent above referred to, series resistors 45 and 46 are provided in series with the output electrodes of diodes 20, 21 and bypass resistor 22.

When an angle-modulated carrier wave is impressed on input circuit 12, the current flowing through diodes 20 and 21 will develop a voltage across stabilizing condenser 23 and bypass resistor 22 which is maintained substantially constant for short-time variations. The current flowing through resistive network 45, 22 and 46 will develop a voltage drop across series resistors 45 and 46. If now the amplitude of the modulated carrier wave is suddenly reduced to a lower value, less current will flow through resistive network 45, 22 and 46 so that the voltage drop across series resistor 45 is reduced. The voltage of the junction point of the anode of diode 20 and series resistor 45 will accordingly become less negative. On the other hand, if the current through diodes 20 and 21 suddenly increases due to an increase of the amplitude of the carrier wave, the voltage drop across series resistor 45 is increased thereby making the voltage obtained from lead 47 more negative. As explained in the above-identified Murakami patent series resistors 45 and 46 will reduce the response of the ratio detector to the undesired amplitude modulation of the modulated carrier wave.

In accordance with the present invention this voltage may be impressed by lead 47 on an intermediate-frequency amplifier such as driver 3 of Fig. 1 to control its gain inversely with fast variations in the amplitude of the carrier wave.

The voltage across series resistor 45 is accordingly responsive to variations of the current flowing through diodes 20 and 21, and this negative feedback voltage may be derived across series resistor 45. Series resistor 45 may in a representative ratio detector have a resistance of 5600 ohms while series resistor 46 may have a resistance of 3300 ohms. The resistance of series resistors 45 and 46 is of the order of twenty percent of the total diode load impedance.

A conventional or slow gain control voltage may also be derived from the junction point between stabilizing condenser 23 and series resistor 45 through filter resistor 48 and lead 50. The two gain control voltages obtained from leads 47 and 50 may either be combined or may be impressed separately on different intermediate-frequency or radio-frequency amplifier stages. The fast automatic gain control voltage obtained from lead 47, however, is preferably impressed upon the last intermediate-frequency amplifier or driver stage immediately ahead of the ratio detector.

There has thus been provided in accordance with the present invention, in an angle-modulated carrier wave receiver, a frequency discriminator having an impedance element responsive to variations of the current flowing through the rectifiers of the discriminator. Thus, a negative feedback voltage may be derived across the impedance element which may be utilized to control the gain of one of the carrier-wave amplifiers inversely with variations in the amplitude of the carrier wave. This negative feedback voltage may be derived, for example, from a ratio detector without providing additional circuit elements. Since the ratio detector is, in first approximation, not responsive to variations in the amplitude of the carrier wave, excellent results may be obtained with a circuit in accordance with the present invention.

What is claimed is:

1. In a receiver for receiving an angle-modulated carrier wave, a carrier-wave transmission channel including at least one carrier-wave amplifier, a frequency discriminator including a frequency-discriminator network coupled to said channel, and having a pair of terminals, for deriving between said terminals and a reference point a pair of phase opposed signal voltages whose relative magnitudes are dependent upon the angular modulation of the wave, a conductive impedance element included in said network and interconnecting said terminals, two rectifiers, each having a cathode and an anode, the cathode of one and the anode of the other one of said rectifiers being coupled to said terminals, a load impedance element connected to said rectifiers, a single direct current path connected between the anode of said one and the cathode of said other one of said rectifiers and which carries substantially all the unidirectional current flowing through both of said rectifiers, a condenser of low impedance to angle modulation-frequency currents connected in parallel to said direct current path, a further impedance element connected serially with said condenser to provide a feedback voltage, a negative feedback circuit for said amplifier connected effectively across said further impedance element to control said amplifier so as to vary its gain inversely with variations in the amplitude of the carrier wave, direct current blocking, carrier wave frequency coupling means connected between said reference point and the anode of said one and the cathode of said other one of said rectifiers respectively for applying said voltages of said pair individually to said rectifiers, and means for deriving the demodulated signal voltage.

2. In an angle-modulated carrier-wave receiver, a carrier-wave transmission channel including at least one carrier-wave amplifier, a ratio detector including a frequency-discriminator network coupled to said channel, and having a pair of terminals, for deriving between said terminals and a reference point a pair of phase opposed signal voltages whose relative magnitudes are dependent upon the angular modulation of the wave, a conductive impedance element included in said network and interconnecting said terminals, two rectifiers, each having a cathode and an anode, the cathode of one and the anode of the other one of said rectifiers being coupled to said terminals, a resistor connected between the anode of said one and the cathode of said other one of said rectifiers which carries substantially all the direct current flowing through said rectifiers, a first condenser of low impedance to angle modulation-frequency currents connected in parallel to said resistor, a second load condenser of high impedance to angle modulation-frequency currents connected between said reference point and the output of one of said rectifiers, and a further impedance element connected in series with said first condenser and one of said rectifiers, and a negative feedback circuit effectively connected across the series combination of said first condenser and said further impedance element and responsive to undesired variations in amplitude of the carrier wave, said circuit being coupled to said amplifier to control its gain inversely with variations in the amplitude of the carrier wave.

3. In an angle-modulated carrier-wave receiver, a carrier-wave transmission channel including at least one carrier-wave amplifier, a ratio detector including a frequency-discriminator network coupled to said channel, and having a pair of terminals, for deriving between said terminals and a reference point a pair of phase opposed signal voltages whose relative magnitudes are dependent upon the angular modulation of the wave, a conductive impedance element included in said network and interconnecting said terminals, two rectifiers, each having a cathode and an anode, the cathode of one and the anode of the other one of said rectifiers being coupled to said terminals, a first resistor connected between the anode of said one and the cathode of said other one of said rectifiers to form a direct current path therewith, a first condenser of low impedance to angle modulation-frequency currents connected in parallel to said first resistor, said first resistor and said first condenser having a time constant which is long compared to a cycle of said angle modulation frequency, a second load condenser of high impedance to angle modulation-frequency currents connected between said reference point and the output of one of said rectifiers, and a second resistor connected in series with said first condenser and one of said rectifiers, a negative feedback circuit connected across said second resistor and responsive to variations of the current flowing through said rectifiers, said circuit being coupled to said amplifier to control its gain inversely with variations in the amplitude of the carrier wave, and a further output circuit coupled to said second load condenser for deriving the demodulated signal voltage.

4. In an angle-modulated carrier-wave receiver, a carrier-wave transmission channel including at least one carrier-wave amplifier, a ratio detector including a frequency-discriminator network coupled to said channel, and having a pair of terminals, for deriving between said terminals and a reference point a pair of phase opposed signal voltages whose relative magnitudes are dependent upon the angular modulation of the wave, a conductive impedance element included in said network and interconnecting said terminals, two rectifiers, each having a cathode and anode, the cathode of one and the anode of the other one of said rectifiers being coupled to said terminals, a first resistor connected between the anode of said one and the cathode of said other one of said rectifiers to form a direct current path therewith, a first condenser of low impedance to angle modulation-frequency currents connected in parallel to said first resistor, said first resistor and said first condenser having a time constant which is long compared to a cycle of said angle modulation frequency, a second load condenser of high impedance to angle modulation-frequency currents connected between said reference point and the output of one of said rectifiers, and a second resistor connected in series with said first condenser and one of said rectifiers, said first condenser and said second resistor shunting said first resistor, a negative feedback circuit connected effectively across said second resistor and responsive to instantaneous undesired variations in the amplitude of the carrier wave, said feedback circuit being connected to said amplifier to control the gain of said amplifier inversely with instantaneous variations in the amplitude of the carrier wave, and a further output circuit coupled to said second load condenser for deriving the demodulated signal voltage.

5. In an angle-modulated carrier-wave receiver, a carrier-wave transmission channel including at least one carrier-wave amplifier, a ratio detector including a frequency-discriminator network coupled to said channel, and having a pair of terminals, for deriving between said terminals and a reference point a pair of phase opposed signal voltages whose relative magnitudes are dependent upon the angular modulation of the wave, a conductive impedance element included in said network and interconnecting said terminals, two rectifiers, each having a cathode and an anode, the cathode of one and the anode of the other one of said rectifiers being coupled to said terminals, a first resistor connected between the anode of said one and the cathode of said other one of said rectifiers to form a direct current path therewith, a first condenser of low impedance to angle modulation-frequency currents connected in parallel to said first resistor, said first resistor and said first condenser having a time constant which is long compared to a cycle of said angle modulation frequency, a second load condenser of high impedance to angle modulation-frequency currents connected between said reference point and the output of one of said rectifiers, and a second resistor connected in series with said first condenser across said first resistor, and a negative feedback circuit including a further amplifier connected across said second resistor and responsive to instantaneous undesired variations in the amplitude of the carrier wave, means for combining the output voltage of said further amplifier and the voltage across said first condenser and said second resistor and for applying the combined voltages to said carrier-wave amplifier to control said carrier-wave amplifier so as to vary its gain inversely with instantaneous and slow variations in the amplitude of the carrier wave, and a further output circuit coupled to said second load condenser for deriving the demodulated signal voltage.

6. In an angle-modulated carrier-wave receiver, a carrier-wave transmission channel including at least one carrier-wave amplifier, a ratio detector including a frequency-discriminator network coupled to said channel, and having a pair of terminals, for deriving between said terminals and a reference point a pair of phase opposed signal voltages whose relative magnitudes are dependent upon the angular modulation of the wave, a conductive impedance element included in said network and interconnecting said terminals, two rectifiers, each having a cathode and an anode, the cathode of one and the anode of the other one of said rectifiers being coupled to said terminals, a first resistor connected between the anode of said one and the cathode of said other one of said rectifiers to form a direct current path therewith, a first condenser of low impedance to angle modulation-frequency currents connected in parallel to said first resistor, said first resistor and said first condenser having a time constant which is long compared to a cycle of said angle modulation frequency, a second load condenser of high impedance to angle modulation-frequency currents connected between said reference point and the output of one of said rectifiers, and a second and a third resistor connected individually in series between said first condenser and the anode of said one rectifier and the cathode of said other one of said rectifiers respectively, a negative feedback circuit connected effectively across one of said second and third resistors and responsive to undesired variations in amplitude of the carrier wave, said feedback circuit being coupled to said amplifier to control its gain inversely with instantaneous variations in the amplitude of the carrier wave, and a further output circuit coupled to said second load condenser for deriving the demodulated signal voltage.

JACK AVINS.

REFERENCES CITED

The following references are of record in the file of this patent:

UNITED STATES PATENTS

| Number | Name | Date |
|---|---|---|
| 2,251,382 | Sziklai | Aug. 5, 1941 |
| 2,253,338 | Lewis | Aug. 19, 1941 |
| 2,261,643 | Brown | Nov. 4, 1941 |
| 2,286,442 | Schock | June 16, 1942 |
| 2,296,092 | Crosby | Sept. 15, 1942 |
| 2,379,688 | Crosby | July 3, 1945 |
| 2,390,502 | Atkins | Dec. 11, 1945 |
| 2,472,301 | Koch | June 7, 1949 |
| 2,497,841 | Seeley | Feb. 17, 1950 |

OTHER REFERENCES

Ratio Detectors for F-M Receivers, Radio for October 1945, pages 18, 19 and 20.